(12) United States Patent
Zheng et al.

(10) Patent No.: US 6,693,321 B1
(45) Date of Patent: Feb. 17, 2004

(54) REPLACING LAYERS OF AN INTERGATE DIELECTRIC LAYER WITH HIGH-K MATERIAL FOR IMPROVED SCALABILITY

(75) Inventors: Wei Zheng, Sunnyvale, CA (US); Arvind Halliyal, Cupertino, CA (US); Mark W. Randolph, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/145,952

(22) Filed: May 15, 2002

(51) Int. Cl.[7] .................. H01L 29/76; H01L 29/788; H01L 31/062; H01L 31/113; H01L 31/119
(52) U.S. Cl. .................. 257/314; 257/295; 257/310; 257/315; 257/316
(58) Field of Search .................. 257/314–316, 257/324, 295, 310

(56) References Cited

U.S. PATENT DOCUMENTS

| | | | |
|---|---|---|---|
| 6,020,238 A | 2/2000 | He et al. | 438/261 |
| 6,048,766 A * | 4/2000 | Gardner et al. | 438/527 |
| 6,163,049 A | 12/2000 | Bui | 257/321 |
| 6,163,050 A * | 12/2000 | Hisatomi et al. | 257/324 |
| 6,495,878 B1 * | 12/2002 | Hayashi et al. | 257/310 |
| 6,512,264 B1 * | 1/2003 | Ogle, Jr. et al. | 257/324 |
| 2001/0011743 A1 * | 8/2001 | Arita et al. | 257/314 |
| 2001/0015456 A1 * | 8/2001 | Bui | 257/324 |
| 2003/0030099 A1 * | 2/2003 | Hsieh et al. | 257/315 |

\* cited by examiner

Primary Examiner—Jerome Jackson
Assistant Examiner—Jesse Fenty
(74) Attorney, Agent, or Firm—Renner, Otto, Boisselle & Sklar, LLP (57) ABSTRACT

A method of making and a semiconductor device formed on a semiconductor substrate having an active region. The semiconductor device includes a gate dielectric layer disposed on the semiconductor substrate. A floating gate is formed on the gate dielectric layer and defines a channel interposed between a source and a drain formed within the active region of the semiconductor substrate. A control gate is formed above the floating gate. Further, the semiconductor device includes an intergate dielectric layer interposed between the floating gate and the control gate. The intergate dielectric layer including a first, a second and a third layers. The first layer formed on the floating gate. The second layer formed on the first layer. The third layer formed on the second layer. Each of the first, second and third layers has a dielectric constant greater than $SiO_2$ and an electrical equivalent thickness of less than about 50 angstroms (Å) of $SiO_2$.

14 Claims, 3 Drawing Sheets

REPLACING LAYERS OF AN INTERGATE DIELECTRIC LAYER WITH HIGH-K MATERIAL FOR IMPROVED SCALABILITY

TECHNICAL FIELD

The present invention generally relates to intergate dielectric layers. In particular, the present invention relates to replacing the layers of an intergate dielectric layer with high-K material for improved scalability.

BACKGROUND

A conventional floating gate FLASH memory device includes a FLASH memory cell characterized by a vertical stack on a semiconductor substrate. The semiconductor substrate is doped with either n-type or p-type impurities to form an active region in the semiconductor substrate. The vertical stack includes a gate dielectric, a floating gate, an intergate dielectric layer and a control gate. The gate dielectric of silicon dioxide ($SiO_2$ gate dielectric), for example, is formed on the semiconductor substrate. The floating gate (sometimes referred as the "charge storing layer") of polysilicon, for example, is formed on the gate dielectric. The intergate dielectric layer (e.g., layers of $SiO_2$, silicon nitride ("nitride") and $SiO_2$) is formed on the floating gate. The control gate of polysilicon, for example, is formed on the intergate dielectric layer. The floating gate formed on the $SiO_2$ gate dielectric defines a channel interposed between a source and a drain formed within the active region of the semiconductor substrate. The source a and drain are formed by dopant impurities introduced into the semiconductor substrate.

Generally speaking, a FLASH memory cell is programmed by inducing hot electron injection from a portion of the semiconductor substrate, such as the channel section near the drain, to the floating gate. Electron injection introduces negative charge into the floating gate. The injection mechanism can be induced by grounding the source and a bulk portion of the semiconductor substrate and applying a relatively high positive voltage to the control gate to create an electron attracting field and applying a positive voltage of moderate magnitude to the drain in order to generate "hot" (high energy) electrons. After sufficient negative charge accumulates in the floating gate, the negative potential of the floating gate raises the threshold voltage of its field effect transistor (FET) and inhibits current flow through the channel during a subsequent "read" mode. The magnitude of the read current is used to determine whether or not a FLASH memory cell is programmed.

The act of discharging the floating gate of a FLASH memory cell is called the erase function. The erase function is typically carried out by a Fowler-Nordheim tunneling mechanism between the floating gate and the source of the transistor (source erase or negative gate erase), or between the floating gate and the semiconductor substrate (channel erase). A source erase operation is induced by applying a high positive voltage to the source and a 0 V to the control gate and the semiconductor substrate while floating the drain of the respective FLASH memory cell.

A pervasive trend in modern integrated circuit manufacture is to produce semiconductor devices, e.g., FLASH memory cells, having feature sizes as small as possible. Many present processes employ features, such as floating gates and interconnects, which have less than a 0.18 $\mu$m critical dimension. As feature sizes continue to decrease, the size of the resulting semiconductor device, as well as the interconnect between semiconductor devices, also decreases. Fabrication of smaller semiconductor devices allows more semiconductor devices to be placed on a single monolithic semiconductor substrate, thereby allowing relatively large circuit systems to is be incorporated on a single, relatively small die area.

As semiconductor device feature sizes decrease, the thicknesses of the $SiO_2$ layers in the intergate dielectric layer decrease as well. This decrease in $SiO_2$ layer thickness is driven in part by the demands of overall device scaling. As floating gate widths decrease, for example, other device dimensions must also decrease in order to maintain proper device operation. Early semiconductor device scaling techniques involved decreasing all dimensions and voltages by a constant scaling factor, to maintain constant electric fields in the device as the feature size decreased. This approach has given way to more flexible scaling guidelines which account for operating characteristics of short-channel devices. A maximum value of semiconductor device subthreshold current can be maintained while feature sizes shrink. Any or all of several quantities may be decreased by appropriate amounts including $SiO_2$ layer thickness, operating voltage, depletion width, and junction depth, for example.

As a result of the continuing decrease in feature size, $SiO_2$ layer thickness has been reduced so much that $SiO_2$ layers of the intergate dielectric layer are approaching thicknesses on the order of ten angstroms (Å). Unfortunately, electrons stored on the floating gate can pass through such thin intergate dielectric layers by quantum mechanical tunneling effect. This charge loss from the floating gate will undesirably alter the memory state stored in the FLASH memory device. This charge leakage due to quantum mechanical tunneling effect increases exponentially with the decrease of the intergate dielectric layer thickness. Therefore, the thickness of the intergate dielectric layer significantly affects the reliability of the floating gate FLASH memory device and is one of the main limiting factor of the scalability of the floating gate memory device.

Another disadvantage of thin SiO2 layers is that a breakdown of the $SiO_2$ layers may also occur at even lower values of gate voltage, as a result of defects in the $SiO_2$ layers. Such defects are unfortunately prevalent in relatively thin $SiO_2$ layers. For example, a thin $SiO_2$ layer often contains pinholes and/or localized voids due to unevenness at which the $SiO_2$ layer grows on a less than perfect silicon lattice or is deposited on the nitride layer. Additionally, the deposition of thin $SiO_2$ layers is more difficult to control due to inherent limitations of the deposition process.

Still another disadvantage is due to the penetration of impurities from a control gate (e.g., boron) into the top $SiO_2$ layer. This penetration of impurities causes a number of problems not only with the quality of the dielectric, but with the device operation. For example, boron penetration shifts a threshold voltage of a MOS device to a more positive value. Also, correlated with boron penetration is the degradation of a device's transconductance and the subthreshold slope.

Therefore, there exists a strong need in the art for an intergate dielectric layer which incorporates high-K dielectric material layers in place of the layers in a conventional ONO layer in order for semiconductor devices to be further scaled without reducing the data retention of the finished device.

SUMMARY OF THE INVENTION

One promising approach for maintaining the capacitance and thickness of the intergate dielectric layer may be to increase the permittivity of the layers in order to "reduce" an electrical equivalent thickness of the layer(s) of the intergate dielectric layer. Permittivity, ∈, of a material reflects the ability of the material to be polarized by an electric field. The permittivity of a material is typically described as its permittivity normalized to the permittivity of a vacuum, $\in_0$. Hence, the relative permittivity, referred to as the dielectric constant, of a material is defined as:

$K=\in/\in_0$

While $SiO_2$ (sometimes simply referred to as "oxide") has a dielectric constant of approximately 3.9, other materials have higher K values. Silicon nitride ("nitride"), for example, has a K of about 6 to 9 (depending on formation conditions) and aluminum oxide ($Al_2O_3$) has a K of about 9 to 10. Much higher K values of, for example, 20 or more can be obtained with various transition metal oxides including tantalum oxide ($Ta_2O_5$), barium strontium titanate ("BST"), and lead zirconate titanate ("PZT").

For example, using a dielectric material with a higher K for one or more of the layers of the intergate dielectric layer would allow a high capacitance and an electrical equivalent thickness of a thinner ONO layer to be achieved while maintaining or increasing the physical thickness of the intergate dielectric layer. For example, an $Al_2O_3$ layer with a K of 9.6 and a physical thickness of 62.5 angstroms (Å) is substantially electrically equivalent to a $SiO_2$ layer (K=3.9) having a physical thickness of 25 angstroms (Å). Further, a nitride layer with a K of 7.8 and a physical thickness of 50 angstroms (Å) is substantially electrically equivalent to a $SiO_2$ layer having a physical thickness of 25 angstroms (Å). Thus, an intergate dielectric layer including two $Al_2O_3$ layers and a nitride layer of 50 angstroms (Å) each would have an electrical equivalent thickness of 75 angstroms (Å) of $SiO_2$, but have a physical thickness of 175 angstroms (Å). Therefore, the intergate dielectric layers can be made electrically thin while being formed of physically thicker layers compared to conventional ONO layers.

According to one aspect of the invention, the invention is a semiconductor device formed on a semiconductor substrate having an active region. The semiconductor device includes a gate dielectric layer disposed on the semiconductor substrate. A floating gate is formed on the gate dielectric layer wherein the floating gate defines a channel interposed between a source and a drain formed within the active region of the semiconductor substrate. A control gate is formed above the floating gate. Further, the semiconductor device includes an intergate dielectric layer interposed between the floating gate and the control gate. The intergate dielectric layer includes three layers. A first layer is formed on the floating gate. A second layer is formed on the first layer. A third layer is formed on the second layer. Each of the first, second and third layers has a dielectric constant greater than $SiO_2$ and an electrical equivalent thickness of less than about 50 angstroms (Å) of $SiO_2$.

According to another aspect of the invention, the invention is a method of fabricating a semiconductor device formed on a semiconductor substrate having an active region. The method includes the step of forming a gate dielectric layer on the semiconductor substrate. Further, the method includes the step of forming a source and a drain within the active region. The method further includes the steps of forming a floating gate on the gate dielectric layer wherein the floating gate defines a channel interposed between the source and drain and of forming a control gate above the floating gate. Additionally, the method includes the step of forming an intergate dielectric interposed between the floating gate and the control gate. The step of forming the intergate dielectric further includes the steps of forming a first layer on the floating gate; forming a second layer on the first layer; and forming a third layer on the second layer. Each of the first, second and third layers have a dielectric constant greater than $SiO_2$ and an electrical equivalent thickness of less than about 50 angstroms (Å) of $SiO_2$.

A reduction in the physical thickness of one or more of the $SiO_2$ layers of the intergate dielectric layer may adversely affect the performance of the finished device, such as the data retention of the FLASH memory device, and increase the difficulty of scaling the device for miniaturization and reduction of power consumption. The replacement of one or more of the $SiO_2$ layers with a high-K material having a dielectric constant higher than $SiO_2$ allows further electrical scaling of the device. Additionally, the high-K material allows for the layers to be manufactured at thicknesses which can be produced with high degrees of quality and precision.

Additionally, the use of high-K material in the intergate dielectric layer decreases its relative electrical thickness. During an erase mode, the electrical field of the high-K intergate dielectric layer is decreased relative to the gate dielectric with a lower K than the intergate dielectric layer such that the electrons will tunnel through the lower K gate dielectric into the semiconductor substrate. The present invention addresses and solves problems stemming from device scaling which require thin $SiO_2$ layers for the intergate dielectric layer between the floating gate and the control gate of a FLASH memory device, for example. Thus, the reliability, the quality, the speed, and the lifetime of the device are increased.

Another technical advantage of the present invention is that process flexibility is increased without adversely affecting device performance. Specifically, the oxide layer or layers can be ultimately formed at a thickness in excess of thin $SiO_2$ requirements while reducing the electrical characteristics by forming such thick oxide layers of a material having a relatively high dielectric constant, such as $Al_2O_3$, titanium oxide or tantalum oxide. In this way, the capacitance of the composite ONO layer between the floating gate and the control gate may be reduced to further scale the device. Consequently, the operating voltage of the device can be reduced even though the thickness of the composite ONO layer is about the same or greater than conventional $SiO_2$-nitride-$SiO_2$ intergate dielectric layer (ONO layer), thereby advantageously enhancing deposition flexibility and hence, facilitating the overall deposition process.

DETAILED DESCRIPTION

In the detailed description that follows, identical components have been given the same reference numerals, regardless of whether they are shown in different embodiments of the present invention. To illustrate the present invention in a clear and concise manner, the drawings may not necessarily be to scale and certain features may be shown in somewhat schematic form.

The present invention is described hereinbelow in terms of a common semiconductor device, specifically, a FLASH memory cell formed on a semiconductor substrate. The present invention is not limited to this illustrative embodiment, however, and may be applied to any semiconductor device in which a dielectric layer is needed, for example, as a gate dielectric in a FET, as an intergate dielectric layer in a floating gate EEPROM FLASH memory device, or the ONO layer in a SONOS-type FLASH memory device, such as the Mirror-Bit™ SONOS-type FLASH memory device available from AMD. Thus, it is to be understood that the present invention is not limited to the specific illustrative embodiments described below.

The present invention relates to a semiconductor device and to a method making the semiconductor device, in which the semiconductor device includes an intergate dielectric layer having alternating layers of high-K dielectric material.

Thus, in an exemplary embodiment, the present invention relates to a semiconductor device having a layered intergate dielectric layer. The semiconductor device includes a semiconductor substrate and a FLASH memory cell formed thereon. The FLASH memory cell is characterized by a vertical stack. The vertical stack includes a floating gate, an intergate dielectric layer, and a control gate. The intergate dielectric layer includes and/or is formed from alternating layers of a first dielectric material and a second dielectric material on the floating gate. Together the alternating layers form the intergate dielectric layer having at least one layer of the first dielectric material and the second dielectric material. The first and second dielectric materials are high-K dielectric materials relative to $SiO_2$. In this exemplary embodiment, the second dielectric material is a nitride material having a high-K dielectric relative to $SiO_2$. Thus, the intergate dielectric layer is an improved oxide-nitride-oxide layer (ONO layer).

The intergate dielectric layer has a physical thickness equal to or greater than a conventional ONO layer formed of $SiO_2$-nitride-$SiO_2$. However, the intergate dielectric layer has an electrical equivalent thickness of an ONO layer having much thinner $SiO_2$ layers. The first dielectric material may be, for example, $Al_2O_3$. $Al_2O_3$ has a dielectric constant of approximately 9.6 or approximately 2.5 times that of $SiO_2$ (K=3.9). Therefore, the two oxide layers of the intergate dielectric layer may be formed to a physical thickness of approximately 62.5 angstroms (Å) each. The nitride layer having a dielectric constant of approximately 7.8 or approximately twice that of $SiO_2$ may be deposited to a physical thickness of approximately 50 angstroms (Å). Such an ONO layer would have an electrical thickness equivalent of 75 angstroms (Å) of $SiO_2$. In other words, each layer has the electrical thickness equivalent of 25 angstroms (Å) of $SiO_2$.

A conventional ONO layer having a physical thickness of 150 angstroms (Å) (i.e., two $SiO_2$ layers and a nitride layer each with a physical thickness of 50 angstroms (Å)) is electrically equivalent to 125 angstroms (Å) of $SiO_2$. Thus in order to further scale a semiconductor device, the conventional ONO layer can be replaced with the intergate dielectric layer having the electrical equivalent thickness of 75 angstroms (Å) of $SiO_2$ and the physical thickness of 175 angstroms (Å) (i.e., two $Al_2O$ layers of 62.5 angstroms (Å) each and a nitride layer of 50 angstroms (Å)). Therefore, the ONO layer having relatively thick $Al_2O_3$ layers may be manufactured using known conventional techniques that is electrically equivalent to an ONO layer having much thinner $SiO_2$ layers. The thickness of the $Al_2O_3$ layers provides greater flexibility in the manufacture thereof and results in higher quality layers as discussed above.

Figure 1:
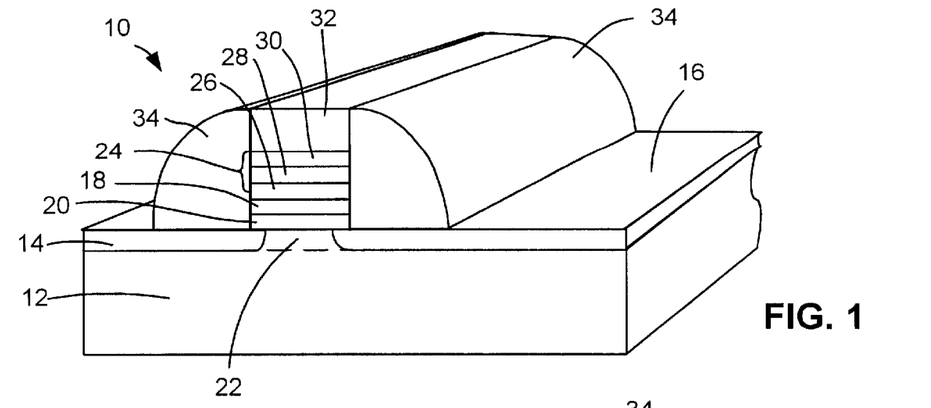
FIG. 1 is a perspective cross-sectional view of a non-volatile memory device including an embodiment of an intergate dielectric layer in accordance with the present invention.
Figure 2:
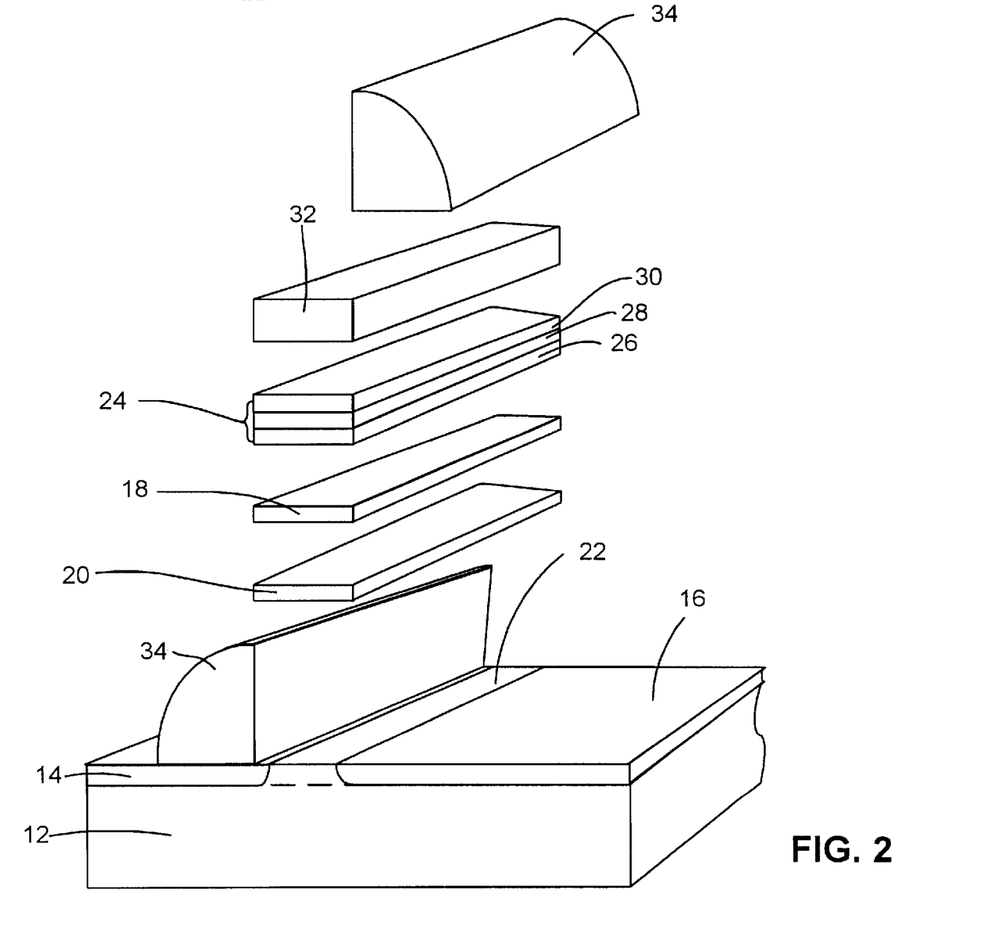
FIG. 2 is a exploded perspective cross-sectional view of the non-volatile memory device including the embodiment of the intergate dielectric layer in accordance with the present invention.

FIGS. 1 and 2 show a semiconductor device of the present invention generally designated as 10. FIG. 1 shows the semiconductor device 10 in a perspective view and FIG. 2 shows the semiconductor device 10 in an exploded perspective view. The semiconductor device 10 comprises a semiconductor substrate 12 having an act thickness of between 800 and 1000 angstroms (Å). A source 14 and a drain 16 are formed in the active region. A floating gate 18 is formed on a gate dielectric 20 which is formed on the 2 semiconductor substrate 12. The floating gate 18 defines a channel 22 between the source 14 and the drain 16. An intergate dielectric layer 24 is formed on the floating gate 18. The intergate dielectric layer 24 comprises alternating layers of high-K dielectric material. In this embodiment, the intergate dielectric layer 24 is comprised of three layers. A first layer 26 is formed on the floating gate 18. A second layer 28 is formed on the first layer 26. A third layer 30 is formed on the second layer 28. A control gate 32 is formed on the intergate dielectric layer 24. The gate dielectric 20, the floating gate 18, the intergate dielectric layer 24, and the control gate 32 form a vertical stack characteristic of a FLASH memory cell. Spacers 34 are formed on the sidewalls of the vertical stack. Isolation techniques that are known in the art may be used to electrically isolate the semiconductor device 10 from other semiconductor devices.

In the exemplary embodiment, as illustrated in FIGS. 1 and 2, the channel 22 may be a p-type region and the source 14 and the drain 16 may be two N+ regions. The channel 22 is interposed between the source 14 and the drain 16. Alternatively, an n-type channel could be interposed between two P+ regions. Although the source 14 and the drain 16 are shown as respective deep implant regions, it should be understood that shallow extension regions could also be formed extending from the respective deep implant regions. The active region may be predoped prior to the manufacture of the floating gate 18 of the semiconductor device 10 with p-type dopings for n-type channel devices and/or n-type dopings for p-type channel devices. Alternatively, the active region may be doped during the manufacture of the floating gate 18.

The gate dielectric 20 interposed between the floating gate 18 and the semiconductor substrate 12 is a single layer dielectric, however, the gate dielectric 20 could be a multi-layer dielectric. The gate dielectric 20 may be made of suitable gate dielectric materials including $SiO_2$ or of dielectric materials having a dielectric constant greater than $SiO_2$ (K=3.9) as will be further discussed below. In this embodiment, gate dielectric 20 is made of $SiO_2$. The gate dielectric 20 may have a thickness of between 50 and 100 angstroms (Å).

The floating gate 18 may be made of typical, well-known gate electrode materials, for example, polysilicon. The exemplary floating gate 18 may have a thickness of between 800 and 1200 angstroms (Å).

The intergate dielectric layer 24 is disposed on the floating gate 18. The intergate dielectric layer 24 is made of alternating layers of high-K dielectric materials as described below. The first layer 26 may be made of $Al_2O_3$ or may be made of another high-K dielectric material described below. The first layer 26 may have a thickness of between 30 and 50 angstroms (Å), for example. The second layer 28 may be made of a high-K material with a dielectric constant greater than that of $SiO_2$, but less than the dielectric constant of the first layer 26. Alternatively, the second layer 28 may have a dielectric constant greater than the first layer 26. The exemplary second layer 28 may have a thickness of between 30 and 50 angstroms (Å). The third layer 30 may be made of the same material as the first layer 26 or may be made of another dielectric material having a high dielectric constant greater than that of $SiO_2$. The exemplary third layer 30 may have a thickness of between 30 and 50 angstroms (Å).

On top of the intergate dielectric layer 24 is the control gate 32. The control gate 32 may be made of typical, well-known gate electrode materials, for example, polysilicon. The exemplary control gate 32 may have a thickness of between 800 and 1200 angstroms (Å).

Not shown in FIG. 1 are additional parts of a working semiconductor device, such as electrical contacts, protective coatings and other parts of the structure which would be included in a complete, working semiconductor device. These additional parts are not necessary to the present invention, and for simplicity and brevity are neither shown nor described, but could be easily added as will be understood by those of skill in the art.

The spacers 34 may be made of typical, well-known materials, for example, tetraethylorthosilicate (TEOS). The exemplary spacers 34 may have thicknesses between 2000 and 3000 angstroms (Å).

In one embodiment, the semiconductor substrate 12 is a bulk silicon semiconductor substrate. In one embodiment, the semiconductor substrate 12 is a silicon-on-insulator semiconductor substrate. In another embodiment, the semiconductor substrate 12 is a p-doped silicon semiconductor substrate. Suitable semiconductor substrates include, for example, bulk lo silicon semiconductor substrates, silicon-on-insulator (SOI) semiconductor substrates, silicon-on-sapphire (SOS) semiconductor substrates, and semiconductor substrates formed of other materials known in the art. The present invention is not limited to any particular type of semiconductor substrate.

As used herein, the term "high-K dielectric" refers to a dielectric material having a K greater than $SiO_2$ (K=3.9).

Such high-K dielectric materials include, for example, silicon oxynitride, which has a K of about 4–8 depending on the relative content of oxygen and nitrogen; silicon nitride, which has a K of about 6–9; $Al_2O_3$, which has a K of about 10; composite materials such as hafnium silicate, which has a K of about 14; hafnium silicon oxynitride, which has a K of about 16, depending on the relative content of oxygen and nitrogen; hafnium silicon nitride, which has a K of about 18; $HfO_2$, $ZrO_2$, $Ta_2O_5$ and others, some of which are identified more fully below.

Approximate K-values or, in some cases, a range of K-values, are shown below in Table 1 for several exemplary dielectric materials. It is understood that the present invention is not limited to the specific dielectric materials disclosed herein, but may include any appropriate high-K dielectric materials which are known and are compatible with the remaining elements of the semiconductor device with which the dielectric materials are to be used.

TABLE 1

| Dielectric Material | Approximate Dielectric Constant (K) (Relative Permittivity) |
|---|---|
| silicon nitride | 6–9 |
| silicon oxynitride | 4–8 |
| aluminum oxide | 10 |
| zirconium silicate | 12 |
| hafnium silicate | 15 |
| lanthanum oxide, $La_2O_3$ | 20–30 |
| hafnium oxide, $HfO_2$ | 40 |
| zirconium oxide, $ZrO_2$ | 25 |
| cerium oxide, $CeO_2$ | 26 |
| bismuth silicon oxide, $Bi_4Si_2O_{12}$ | 35–75 |
| titanium dioxide, $TiO_2$ | 30 |
| tantalum oxide, $Ta_2O_5$ | 26 |
| tungsten oxide, $WO_3$ | 42 |
| yttrium oxide, $Y_2O_3$ | 20 |
| $LaAlO_3$ | 25 |
| BST ($Ba_{1-x}Sr_xTiO_3$) | ~20–~200 |
| $PbTiO_3$ | ~20–~200 |
| $BaTiO_3$ | ~20–~200 |
| $SiTiO_3$ | ~20–~200 |
| $PbZrO_3$ | ~20–~200 |
| PST ($PbSc_xTa_{1-x}O_3$) | ~200–~3000 |
| PZN ($PbZn_xNb_{1-x}O_3$) | ~200–~5000 |
| PZT ($PbZr_xTi_{1-x}O_3$) | ~100–~1000 |
| PMN ($PbMg_xNb_{1-x}O_3$) | ~200–~5000 |

It is noted that the K-values, or relative permittivity, for high-K dielectric materials may vary to some degree depending on the exact nature of the dielectric material and on the process used to deposit the material. Thus, for example, differences in purity, crystallinity and stoichiometry, may give rise to variations in the exact K-value determined for any particular dielectric material.

As used herein, when a material is referred to by a specific chemical name or formula, the material may include non-stoichiometric variations of the stoichiometrically exact formula identified by the chemical name. For example, tantalum oxide, when stoichiometrically exact, has the chemical formula $Ta_2O_5$. As used herein, the term "tantalum oxide" may include variants of stoichiometric $Ta_2O_5$, which may be referred to as $Ta_{xO_y}$, in which either of x or y vary by a small amount. For example, in one embodiment, x may vary from about 1.5 to about 2.5, and y may vary from about 4.5 to about 5.5. In another embodiment, x may vary from about 1.75 to about 2.25, and y may vary from about 4.0 to about 6.0. Such variations from the exact stoichiometric formula fall within the definition of tantalum oxide. Similar variations from exact stoichiometry are included when the chemical formula for a compound is used. For example, again using tantalum oxide as an example, when the formula $Ta_2O_5$ is used, $Ta_xO_y$ as defined above, is included within the meaning. Thus, in the present disclosure, exact stoichiometry is intended only when such is explicitly so stated. As will be understood by those of skill in the art, such variations may occur naturally, or may be sought and controlled by selection and control of the conditions under which materials are formed.

Here and in all numerical values in the specification and claims, the limits of the ranges and ratios may be combined.

The present invention further relates to a method of making the above-described semiconductor device 10. First, a semiconductor substrate 12, including an active region, is provided. Next, a gate dielectric 20 is deposited on the semiconductor substrate 12. Then, a floating gate 18 is deposited on the gate dielectric 20. Next, the semiconductor substrate 12 is doped to form a source 14 and a drain 16. Afterwards, alternating layers of a first dielectric material and a second dielectric material are deposited on the floating gate 18 which together form an intergate dielectric layer 24. The intergate dielectric layer 24 has at least two layers of at least one of a first dielectric material and a second dielectric material. One of the at least two layers of the first dielectric material and the second dielectric material is a high-K dielectric material. Finally, a control gate 32 is deposited on the intergate dielectric layer 24. Together, the gate dielectric 20, the floating gate 18, the intergate dielectric layer 24 and the control gate 32 form a vertical stack on the semiconductor substrate 12 characteristic of a FLASH memory cell. Spacers 34 may be formed on the sidewalls of the vertical stack.

In one embodiment, the high-K dielectric material is deposited by chemical vapor deposition (CVD). The CVD method may be any appropriate CVD method known in the art. For example, the CVD method may be ALD, PECVD or RTCVD. In one embodiment, the high-K dielectric material is deposited by a nitridation method. In one embodiment, the high-K dielectric materials are deposited in the same apparatus. In one embodiment, both the high-K dielectric materials are deposited sequentially by controlling the supply of precursor materials to the CVD apparatus.

In an alternative embodiment, the layers may be deposited one at a time, in separate apparatus. This alternative embodiment allows for different deposition methods to be used for the respective layers.

Figure 7:
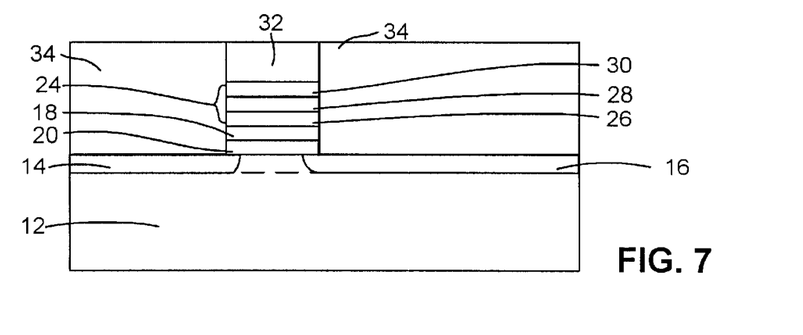
FIG. 7 is a schematic cross-sectional view of a semiconductor substrate with the non-volatile memory device at another intermediate stage of manufacture in accordance with the present invention.
Figure 8:
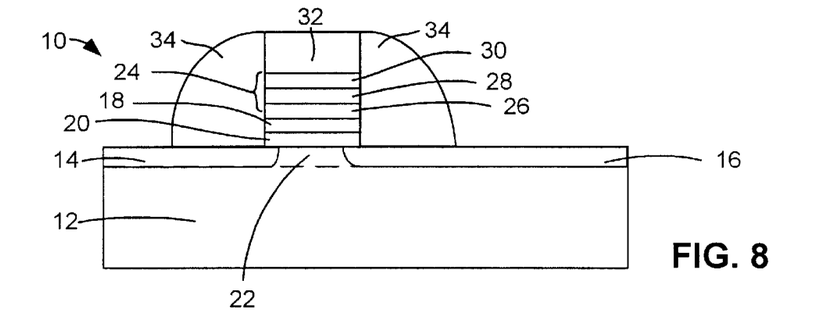
FIG. 8 is a schematic cross-sectional view of a semiconductor substrate with the non-volatile memory device at another intermediate stage of manufacture in accordance with the present invention.
Figure 9:
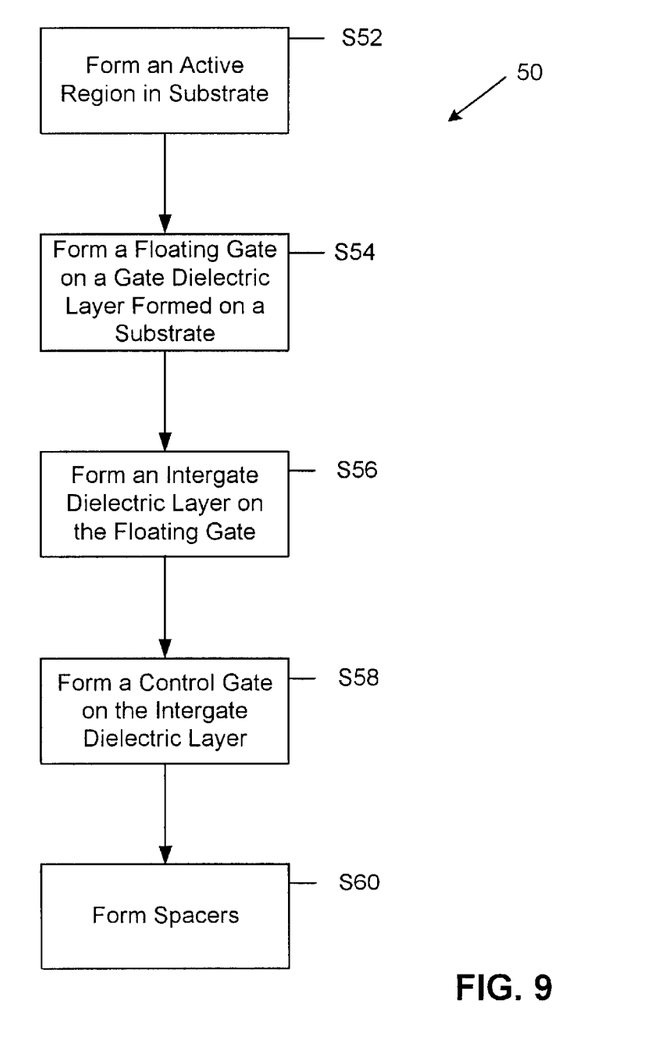
FIG. 9 is a schematic flow diagram showing the basic steps in a process of making a semiconductor device in accordance with the present invention.

The method of making the semiconductor device 10 having the intergate dielectric layer 24 is now described in detail with reference to FIGS. 3–9. FIG. 9 is a flow diagram 50 schematically presenting the steps of making the semiconductor device 10 of the present invention.

Figure 3:
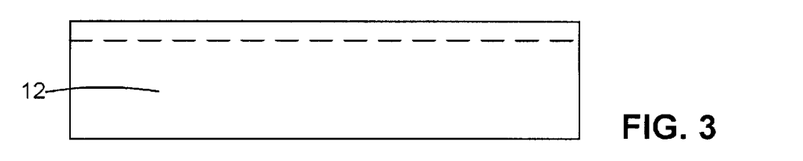
FIG. 3 is a schematic cross-sectional view of a semiconductor substrate with the non-volatile memory device at an intermediate stage of manufacture in accordance with the present invention.

In the first step of the method of the present invention, shown in FIG. 9 as Step S52, the semiconductor substrate 12 is provided, as shown in FIG. 3. The semiconductor substrate 12 may be any appropriately selected semiconductor substrate known in the art, as described above. The semiconductor substrate 12 may be subjected to implants to provide an active region in the semiconductor substrate 12 as is known in the art. For instance, boron or indium may be implanted to form a p-type region or channel for an n-type device and phosphorous or arsenic may be implanted to form an n-type region or channel for a p-type device. An exemplary range of concentration of these dopings is between $1\times10^{18}$ and $5\times10^{18}$ atoms/cm$^3$ for the p-type channel 22.

Next in Step S54, the gate dielectric 20 of $SiO_2$ is formed on the semiconductor substrate 12. The gate dielectric 20 of $SiO_2$ may be thermally grown or deposited to a thickness between 50 and 100 angstroms (Å). Then, the floating gate 18 is formed on the gate dielectric 20. Initially, an undoped layer of polysilicon may be deposited on the gate dielectric 20. The polysilicon layer of the floating gate 18 may be deposited to between about 1000 and 1500 angstroms (Å) thick. Following the deposition of the polysilicon layer, it may be polished back to a thickness of between 800 and 1200 angstroms (Å) thick. Next, the polysilicon layer is patterned to form the floating gate 18. Following the patterning of the floating gate 18, an implantation step may be done at this time to implant the polysilicon of the floating gate 18. Alternatively, the polysilicon layer may be N+ predoped, for example.

Next, a nitride layer 36 is formed on the floating gate 18. The nitride layer 36 may be formed by a nitridation process as described above. The nitride layer 36 would be deposited and patterned in order to protect the floating gate 18 from, for example, boron penetration, during an implant to form the source 14 and the drain 16.

Figure 4:
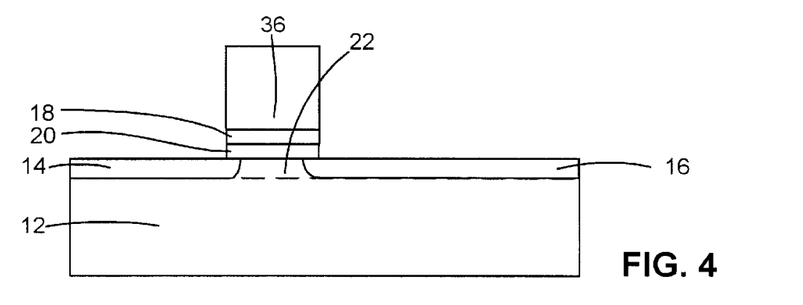
FIG. 4 is a schematic cross-sectional view of a semiconductor substrate with the non-volatile memory device at another intermediate stage of manufacture in accordance with the present invention.

Next, the semiconductor substrate 12 may be subjected to implants to produce the source 14 and the drain 16. The source 14 and the drain 16 may be formed by a main perpendicular implant. The main perpendicular implant is a relatively high energy, high concentration implant which is capable of producing the source 14 and the drain 16. Either boron, arsenic, or phosphorous may be used alone or in any combination as the dopant atoms. An exemplary range of implant dose of the perpendicular implant is between $1\times10^{15}$ and $2\times10^{15}$ atoms/cm$^2$. An exemplary range of concentration of these dopings is between $1\times10^{20}$ and $2\times10^{20}$ atoms/cm$^3$ for the source 14 and the drain 16. The dopants may be selected from other dopant materials known in the art. The resulting structure is shown in FIG. 4.

Although the source 14 and the drain 16 are shown as main implantation regions, it should be understood that extension implantation may be done in order to form extension regions as is known in the art. It should also be understood that the formation of the source 14 and drain 16 may take place before the formation of the floating gate 18 or after the formation of the FLASH memory vertical stack.

Figure 5:
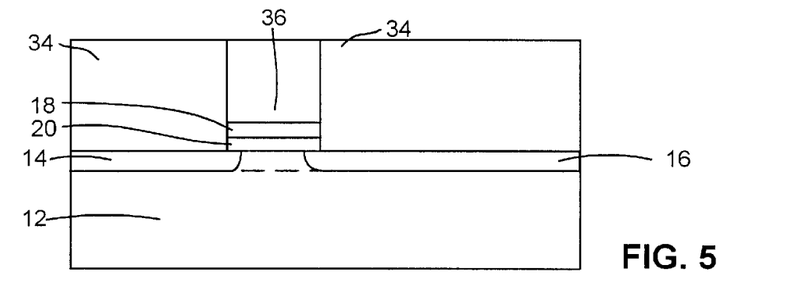
FIG. 5 is a schematic cross-sectional view of a semiconductor substrate with the non-volatile memory device at another intermediate stage of manufacture in accordance with the present invention.

Next, a TEOS layer 34 is deposited on the semiconductor substrate 12 and the nitride topped gate. The layer of TEOS reaches between 500 and 1000 angstroms (Å) above the nitride layer 36 of the nitride topped gate. Next, the TEOS is polished back to the top surface of the nitride layer 36 of the nitride topped gate. The polishing is done using conventional techniques, which are well-known in the art. The intermediate semiconductor device is shown in FIG. 5.

In the third step of the method of the present invention, shown in FIG. 9 as Step S56, an etch of hot phosphoric acid is performed on the nitride layer 36 down to the floating gate 18. Thus, all of the nitride layer 36 is removed to leave an upper surface of the floating gate 18 exposed. It should be appreciated that other suitable selective etching methods well-known in the art may be used.

Next, layers 26, 28 and 30 of alternating high-K dielectric materials (as described above) are formed on the floating gate 18 in an opening defined by the TEOS layer 34 using techniques described below. In an exemplary embodiment, the first layer 26 and the third layer 30 are of $Al_2O_3$. The second layer 28 is nitride.

In this exemplary embodiment in which aluminum oxide and nitride are the first and second dielectric materials, the aluminum is supplied in the form of an aluminum-containing gas such as aluminum chloride; the nitride is supplied in the form of ammonia gas, NH₃; and the oxygen is supplied in the gaseous form. Since the first layer 26 is to be aluminum oxide, the aluminum-containing gas and the oxygen are first provided to the CVD apparatus. When a suitable thickness of aluminum oxide has been deposited, the flow of the aluminum-containing gas is stopped, and a flow of NH₃ gas is provided to the CVD apparatus. When a suitable thickness of nitride has been deposited, the flow of the NH₃ gas is stopped, and the flow of aluminum-containing gas is started again, together with the oxygen gas, and continued until a suitable thickness of aluminum oxide is deposited. This process of alternating layer deposition may be continued until a suitable, selected number of layers of desired thickness has been deposited. In the exemplary embodiment, three layers are deposited.

Figure 6:
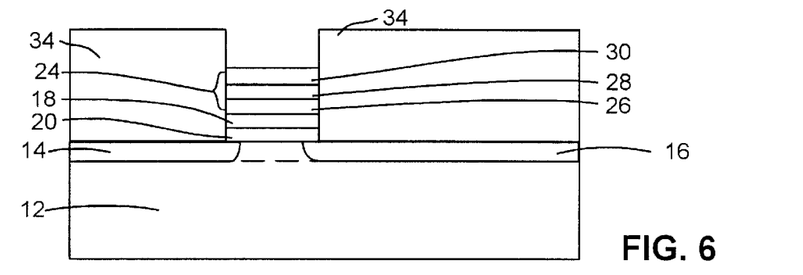
FIG. 6 is a schematic cross-sectional view of a semiconductor substrate with the non-volatile memory device at another intermediate stage of manufacture in accordance with the present invention.

The intergate dielectric layer 24 results from the above formation of alternate layers. It should be understood the third step, S56, can be broken down into a series of steps in which each of the alternating layers 26, 28 and 30 are deposited in a separate apparatus. Alternatively, the second layer 28 (i.e., the nitride layer) could be deposited using a conventional RTA technique. The resulting intermediate semiconductor device is shown in FIG. 6.

Next, in Step S58, an undoped polysilicon layer is deposited on the intergate dielectric layer 24 through the opening defined by the TEOS layers 34. The undoped polysilicon layer 32 is deposited between 500 and 1000 angstroms (Å) above the upper surface of the TEOS layer 34. Next, the undoped polysilicon layer is polished back to be even with the upper surface of the TEOS layer 34. The polishing is done using conventional techniques, which are well-known in the art. The polysilicon may be N+predoped or an implantation step may be done at this time to implant the polysilicon. The resulting structure is illustrated in FIG. 7.

Subsequently, connections such as word lines may be formed using conventional techniques in order to establish electrical connections between the semiconductor device 10 and other nodes (such as an I/O pad or Vss), the source 14 or the drain 16 of the device as well as a power supply or a ground, if desired. The formation of the connections are not shown.

Next in Step S60, the TEOS layer 34 is etched with a suitable etchant. The TEOS layer 30 34 is reduced in size, leaving the TEOS spacers 34 shown in FIG. 8. The TEOS spacers 34 may extend from the surface of the semiconductor substrate 12 to a height of between 2000 and 3000 angstroms (Å).

After implantation, the semiconductor device 10 is subjected to rapid thermal annealing (RTA). Exemplary RTA may be performed for between 5 and 15 seconds at a temperature of 1020–1050° C.

The intergate dielectric layer 24 (FIGS. 1–2 and FIGS. 6–8) is depicted with discrete layers. When the layers, i.e., layers 26, 28 and 30, are deposited, the layers are discrete as shown in FIGS. 6–8, for example. Following the step of annealing to activate the source 14 and the drain 16, the respective first and second dielectric materials in the layers may combine or react with each other to form a reaction product which is a composite or hybrid material. In other words, to some degree, each of the discrete layers may blend into the adjacent layers so that the boundary from one layer to the next is indeterminate. The various layers shown in the drawings are depicted with discrete boundaries, but this may not be the case in actual practice. Thus, while the intergate dielectric layer 24 is shown as comprising a total of three discrete layers as a result of the annealing step, to some degree, the layers may lose their discrete character and blend together, at least at the interfaces between the layers.

The present invention enables further device scaling without adverse impact on device performance. In addition, the present invention improves deposition flexibility by enabling deposition of one or both of the layers 26 and 30 of the intergate dielectric layer 24 (ONO layer) to a thickness greater than a conventional ONO layer, by utilization of a material with a dielectric constant greater than that of $SiO_2$. Due to the inherent limitations of the deposition process, the control of oxide layer thickness becomes more difficult as dimensions shrink. By enabling thicker and therefore more readily and accurately deposited oxide layers to be used in the composite ONO layer, the methodology of the present invention facilitates cost-effective device scaling and allows greater flexibility in oxide deposition. Additionally, the intergate dielectric layer 24 with a relatively high-K electrical equivalence improves the device operation. Specifically, the increased electric field of the intergate dielectric layer 24 increases the likelihood that the electrons in the floating gate 18 will tunnel through the lower K dielectric material of the $SiO_2$ using a tunneling phenomenon to the semiconductor substrate 12 during an erase mode.

Although particular embodiments of the invention have been described in detail, it is understood that the invention is not limited correspondingly in scope, but includes all changes, modifications and equivalents coming within the spirit and terms of the claims appended hereto. Additionally, although the flow diagram of FIG. 9 shows a specific order of execution, it is understood that the order of execution may differ from that which is depicted. For example, the order of execution of two or more blocks may be scrambled relative to the order shown. Also, two or more blocks shown in succession in FIG. 9 may be executed concurrently or with partial concurrence.

What is claimed is:

1. A semiconductor device formed on a semiconductor substrate having an active region, the semiconductor device comprising:

a gate dielectric layer disposed on the semiconductor substrate;

a floating gate formed on the gate dielectric layer defining a channel interposed between a source and a drain formed within the active region of the semiconductor substrate;

a control gate formed above the floating gate; and an intergate dielectric layer interposed between the floating gate and the control gate, the intergate dielectric layer comprising:

a first layer formed on the floating gate;

a second layer formed on the first layer; and a third layer formed on the second layer;

wherein each of the first, second and third layers has a dielectric constant greater than $SiO_2$, wherein the first and third layers each have a dielectric constant greater than the dielectric constant of the second layer, and wherein the second layer has a dielectric constant greater tan the dielectric constant of silicon nitride.

2. The semiconductor device according to claim 1, wherein the first layer material is one or more of $Al_2O_3$, $HfO_2$, $ZrO_2$, $Ta_2O_5$, $BaTiO_3$, $TiO_2$, $CeO_2$, BST ($Ba_{1-x}Sr_xO_3$), PZN ($PbZn_xNb_{1-x}O_3$) and PST ($PbSc_xTa_{1-x}O_3$).

3. The semiconductor device according to claim 2, wherein the first layer is $Al_2O_3$.

4. The semiconductor device according to claim 1, wherein the third layer material is one or more of $Al_2O_3$, $HfO_2$, $ZrO_2$, $Ta_2O_5$, $BaTiO_3$, $TiO_2$, $CeO_2$, BST ($Ba_{1-x}Sr_xO_3$), PZN ($PbZn_xNb_{1-x}O_3$) and PST ($PbSc_xTa_{1-x}O_3$).

5. The semiconductor device according to claim 4, wherein the third layer is $Al_2O_3$.

6. The semiconductor device according to claim 1, wherein the first and third layers each comprise one or more of $Al_2O_3$, $HfO_2$, $ZrO_2$, $Ta_2O_5$, $BaTiO_3$, $TiO_2$, $CeO_2$, BST ($Ba_{1-x}Sr_xO_3$), PZN ($PbZn_xNb_{1-x}O_3$) and PST ($PbSc_xTa_{1-x}O_3$).

7. The semiconductor device according to claim 6, wherein the first and third layers are $Al_2O_3$.

8. The semiconductor device according to claim 6, wherein the second layer comprises one or more of $Al_2O_3$, $HfO_2$, $ZrO_2$, $Ta_2O_5$, $BaTiO_3$, $TiO_2$, $CeO_2$, BST ($Ba_{1-x}Sr_xO_3$), PZN ($PbZn_xNb_{1-x}O_3$) and PST ($PbSc_xTa_{1-x}O_3$).

9. The semiconductor device according to claim 6, wherein the second layer is $Ta_2O_5$.

10. The semiconductor device according to claim 1, wherein the second layer material is one or more of $Al_2O_3$, $HfO_2$, $ZrO_2$, $Ta_2O_5$, $BaTiO_3$, $TiO_2$, $CeO_2$, BST ($Ba_{1-x}Sr_xO_3$), PZN ($PbZn_xNb_{1-x}O_3$) and PST ($PbSc_xTa_{1-x}O_3$).

11. A method of fabricating a semiconductor device formed on a semiconductor substrate having an active region, the method comprising the steps of:

forming a gate dielectric layer on the semiconductor substrate;

forming a source and a drain within the active region of the semiconductor substrate;

forming a floating gate on the gate dielectric layer wherein the floating gate defines a channel interposed between the source and drain;

forming a control gate above the floating gate; and forming an intergate dielectric interposed between the floating gate and the control gate, wherein the step of forming the intergate dielectric further includes the steps of;

forming a first layer on the floating gate;

forming a second layer on the first layer; and forming a third layer on the second layer, wherein each of the first, second and third layers have a dielectric constant greater than $SiO_2$, wherein the first and third layers each have a dielectric constant greater than die dielectric constant of the second layer, and wherein the second layer has a dielectric constant greater than the dielectric constant of silicon nitride.

12. The method according to claim 11, further including the step of:

forming the first and Third layers of $Al_2O_3$.

13. The method of claim 11, further including the step of forming the first and of one or more of $Al_2O_3$, $HfO_2$, $ZrO_2$, $Ta_2O_5$, $BaTiO_3$, $TiO_2$, $CeO_2$, BST ($Ba_{1-x}Sr_xO_3$), PZN ($PbZn_xNb_{1-x}O_3$) and PST ($PbSc_xTa_{1-x}O_3$).

14. The method of claim 12, further including the step of:

forming the second layer of one or more of $Al_2O_3$, $HfO_2$, $ZrO_2$, $Ta_2O_5$, $BaTiO_3$, $TiO_2$, $CeO_2$, BST ($Ba_{1-x}Sr_xO_3$), PZN ($PbZn_xNb_{1-x}O_3$) and PST ($PbSc_xTa_{1-x}O_3$).

* * * * *

UNITED STATES PATENT AND TRADEMARK OFFICE
CERTIFICATE OF CORRECTION

PATENT NO.      : 6,693,321 B1
DATED           : February 17, 2004
INVENTOR(S)     : Zheng et al.

It is certified that error appears in the above-identified patent and that said Letters Patent is hereby corrected as shown below:

Column 1,
Line 30, replace "source a and" with -- source and --.

Column 2,
Line 5, replace "to is be" with -- to be --.

Column 6,
Line 37, replace "an act thickness" with -- an active region. The active region may have a thickness --.
Line 40, replace "the 2 semiconductor" with -- the semiconductor --.

Column 7,
Line 59, replace "bulk lo silicon" with -- bulk silicon --.

Column 12,
Line 60, replace "tan" with -- than --.
Line 63, replace "$Ba_{1x}Sr_xO_3$" with -- $Ba_{1-x}Sr_xO_3$ --.

Column 13,
Lines 3, 10 and 16, replace "$Ba_{1x}Sr_xO_3$" with -- $Ba_{1-x}Sr_xO_3$ --.

Column 14,
Line 15, replace "die" with -- the --.

Signed and Sealed this

Twentieth Day of April, 2004

JON W. DUDAS
*Acting Director of the United States Patent and Trademark Office*